(12) United States Patent
Avanzino et al.

(10) Patent No.: US 8,084,770 B2
(45) Date of Patent: Dec. 27, 2011

(54) TEST STRUCTURES FOR DEVELOPMENT OF METAL-INSULATOR-METAL (MIM) DEVICES

(75) Inventors: Steven Avanzino, Cupertino, CA (US); Suzette K. Pangrle, Cupertino, CA (US); Manuj Rathor, Milpitas, CA (US); An Chen, Sunnyvale, CA (US); Sameer Haddad, San Jose, CA (US); Nicholas Tripsas, San Jose, CA (US); Matthew Buynoski, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/313,089

(22) Filed: Nov. 17, 2008

(65) Prior Publication Data
US 2009/0072234 A1    Mar. 19, 2009

Related U.S. Application Data

(62) Division of application No. 11/633,930, filed on Dec. 5, 2006, now Pat. No. 7,468,525.

(51) Int. Cl.
*H01L 29/10* (2006.01)

(52) U.S. Cl. .......... 257/48; 257/532; 257/E21.521; 257/E21.524; 257/E29.343

(58) Field of Classification Search ............ 257/48, 257/532, E21.521, E21.524, E29.343
See application file for complete search history.

(56) References Cited

U.S. PATENT DOCUMENTS

| | | | |
|---|---|---|---|
| 6,495,874 B1 | 12/2002 | Kawamura et al. | 257/301 |
| 6,768,153 B2 | 7/2004 | Hoshi | 257/300 |
| 6,790,685 B2 | 9/2004 | Lee | 438/14 |
| 6,940,114 B2 * | 9/2005 | Oh et al. | 257/296 |
| 7,045,839 B2 * | 5/2006 | Song et al. | 257/295 |
| 7,170,090 B1 | 1/2007 | Chaparala et al. | 257/48 |
| 7,348,623 B2 | 3/2008 | Akiyama | 257/303 |
| 2003/0042521 A1 | 3/2003 | Yoshitomi et al. | 257/296 |
| 2003/0162351 A1 * | 8/2003 | Jenq | 438/239 |
| 2004/0099897 A1 * | 5/2004 | Tsutsue et al. | 257/303 |
| 2004/0135186 A1 * | 7/2004 | Yamamoto | 257/296 |
| 2005/0233563 A1 * | 10/2005 | Hall et al. | 438/597 |
| 2007/0034988 A1 * | 2/2007 | Won et al. | 257/532 |

* cited by examiner

*Primary Examiner* — Andy Huynh

(57) ABSTRACT

In the present electronic test structure comprising, a conductor is provided, overlying a substrate. An electronic device overlies a portion of the conductor and includes a first electrode connected to the conductor, a second electrode, and an insulating layer between the first and second electrodes. A portion of the conductor is exposed for access thereto.

7 Claims, 8 Drawing Sheets

TEST STRUCTURES FOR DEVELOPMENT OF METAL-INSULATOR-METAL (MIM) DEVICES

This is a Divisional Application of U.S. patent application Ser. No. 11/633,930, entitled TEST STRUCTURES FOR DEVELOPMENT OF METAL-INSULATOR-METAL (MIM) DEVICES, filed Dec. 5, 2006 now U.S. Pat. No. 7,468,525, assigned to Spansion LLC.

BACKGROUND OF THE INVENTION

1. Technical Field

This invention relates generally to electronic devices, and more particularly, to an approach for testing Metal-Insulator-Metal (MIM) devices for development thereof.

2. Background Art

FIG. 1 illustrates a two-terminal metal-insulator-metal (MIM) resistive memory device 30. The memory device 30 includes a metal, for example copper electrode 32, an active layer 34 of for example copper oxide on and in contact with the electrode 32, and a metal, for example copper electrode 36 on and in contact with the active layer 34. As an example of the operation of such a device 30, with reference to FIG. 2, initially, assuming that the memory device 30 is unprogrammed, in order to program the memory device 30, ground is applied to the electrode 32, while a positive voltage is applied to electrode 36, so that an electrical potential $V_{pg}$ (the "programming" electrical potential) is applied across the memory device 30 from a higher to a lower electrical potential in the direction from electrode 36 to electrode 32. Upon removal of such potential the memory device 30 remains in a conductive or low-resistance state having an ON-state resistance.

In the read step of the memory device 30 in its programmed (conductive) state, an electrical potential $V_r$ (the "read" electrical potential) is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device 30, a positive voltage is applied to the electrode 32, while the electrode 36 is held at ground, so that an electrical potential $V_{er}$ (the "erase" electrical potential) is applied across the memory device 30 from a higher to a lower electrical potential in the direction of from electrode 32 to electrode 36.

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the active layer 34 (and memory device 30) in a high-resistance or substantially non-conductive OFF state, the memory device 30 will not conduct significant current, which indicates that the memory device 30 is in its erased state.

It will be understood that the development of MIM devices is ongoing, as is clearly desirable to improve the performance thereof (for example, improved switching speed and data retention, improved immunity to performance degradation at elevated temperatures, etc.)

Therefore, what is needed is an approach for testing MIM devices which promotes development of these devices, by being simple in design and fabrication and effective in use.

DISCLOSURE OF THE INVENTION

Broadly stated, the present electronic test structure comprises a substrate, a conductor overlying the substrate, an electronic device overlying a portion of the conductor and comprising a first electrode connected to the conductor, a second electrode, and an insulating layer between the first and second electrodes, a portion of the conductor being exposed for access thereto.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
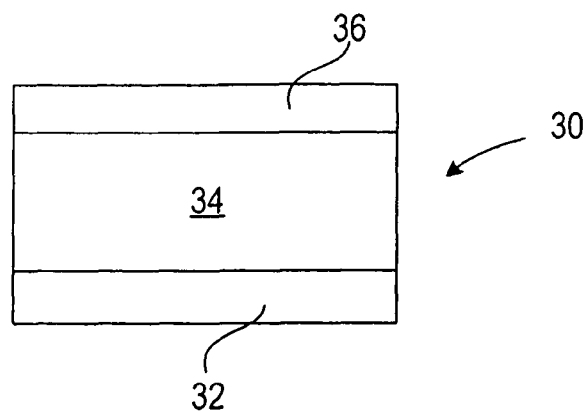
FIG. 1 is a cross-sectional view of an above-described memory device.
Figure 2:
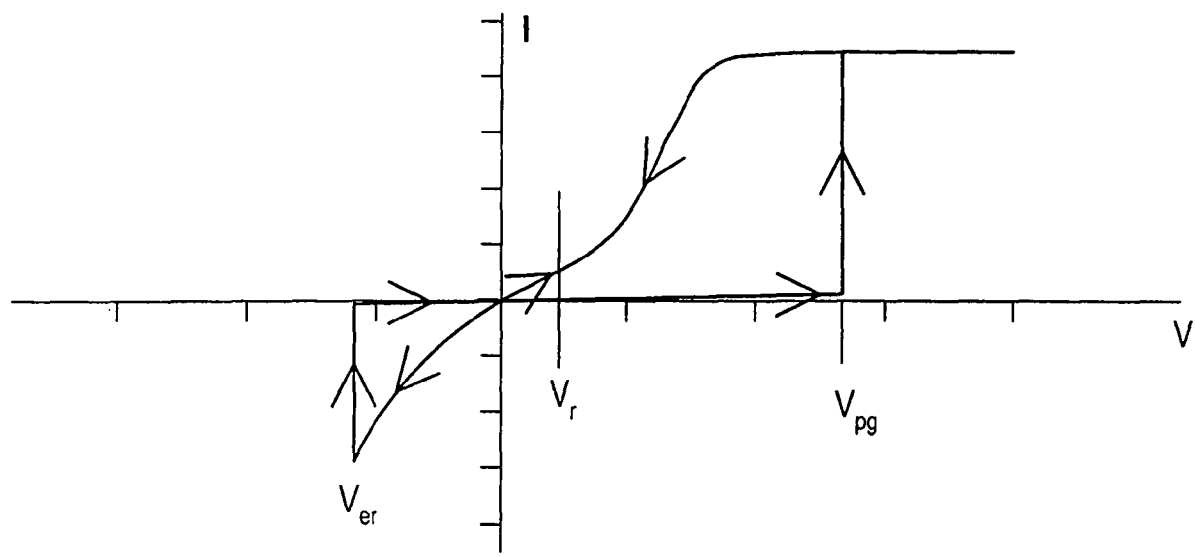
FIG. 2 is a plot of current vs. voltage illustrating operating characteristics of the memory device of FIG. 1.
Figure 3:
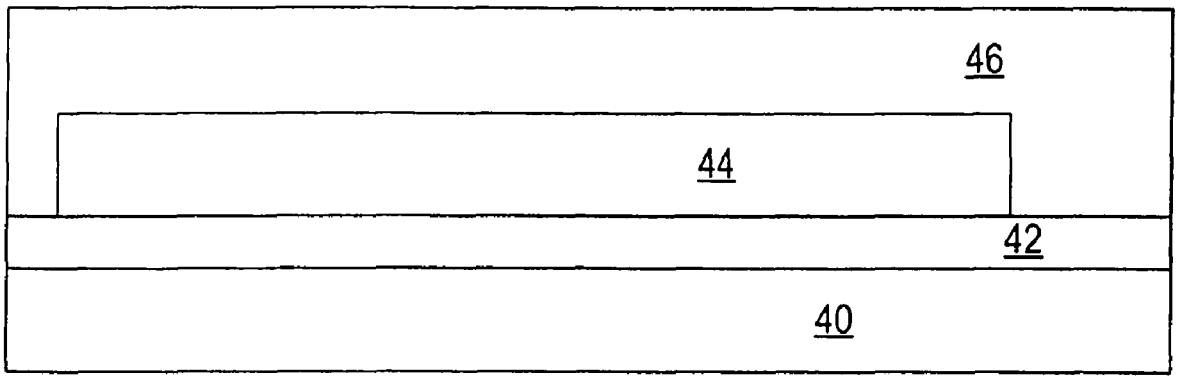
FIGS. 3-9 illustrate process steps in fabricating a first embodiment of test structure.
Figure 4:
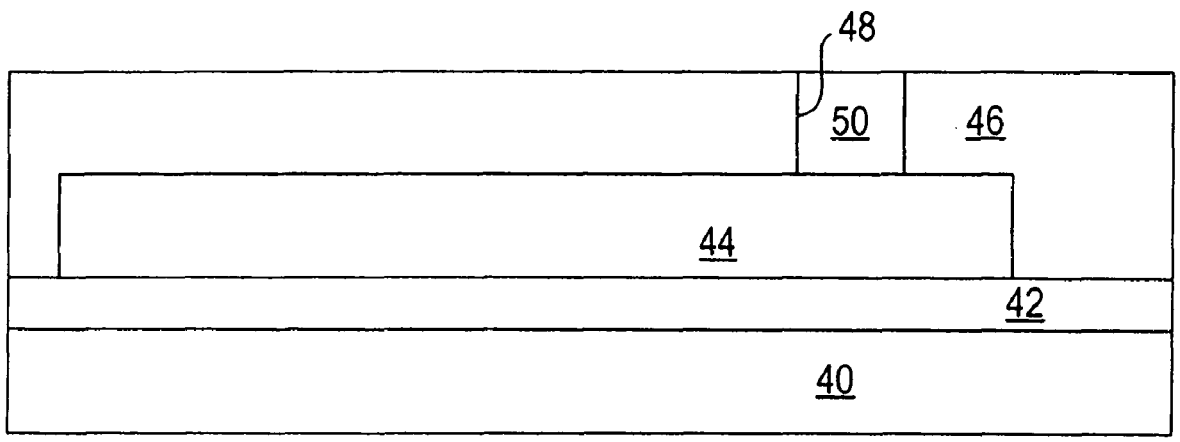
Figure 5:
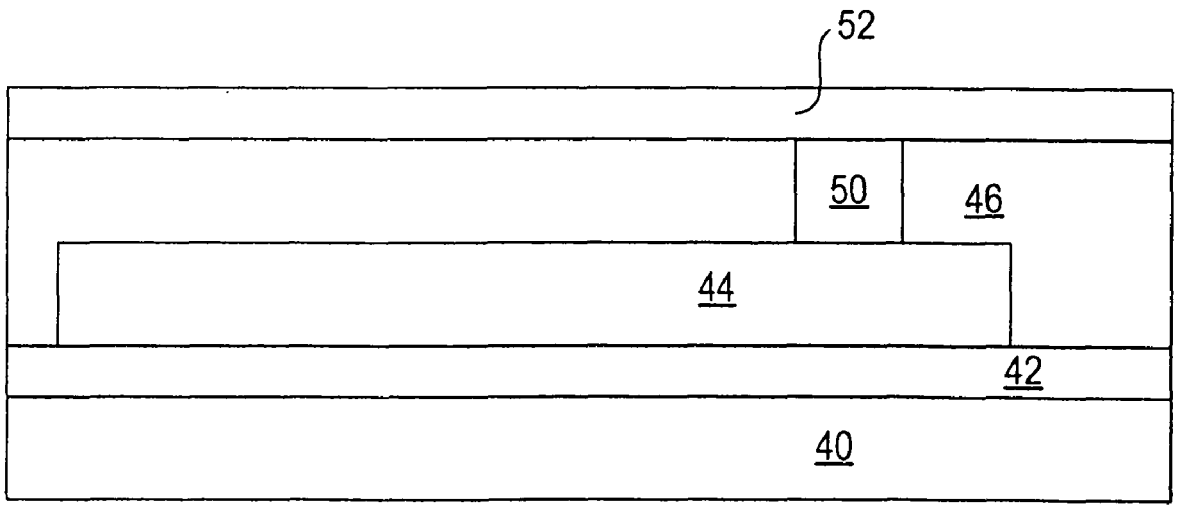

FIGS. 3-9 illustrate the fabrication of a first embodiment of the invention. Initially, a p-semiconductor substrate 40 is provided, and a layer of $SiO_2$ 42 is provided thereover. A metal, for example W layer 44 is provided over the $SiO_2$ layer 42 and, using standard lithographic techniques, is patterned as shown. Another layer of $SiO_2$ 46 is provided over the resulting structure. Again using standard photolithographic techniques, an opening 48 is provided in the $SiO_2$ 46 layer down to the W layer 44, and the opening 48 is filled with W to form a conductive plug 50 (FIG. 4). A conductive layer 52 is provided on the resulting structure (FIG. 5) using any suitable technique, such as physical vapor deposition, i.e. PVD (evaporation, sputtering, molecular beam, etc.), chemical vapor deposition (CVD, PECVD, ALD, etc.), electro- or electroless plating and the like. In this particular embodiment, PVD sputter deposition is used, allowing for in situ sputter-etching of the W plug 50 to remove native W oxide.

A variety of conductors can be used for the conductive layer 52. For example, metals such as Ta, Ti, Ni, Cu, Co, Au, Ag, Pt, Pd, W, Cr, Ca or Al can be used. Likewise, nonmetals such as TaN, TiN, ITO, $RuO_2$ and $SrRuO_3$ can be used.

Figure 6:
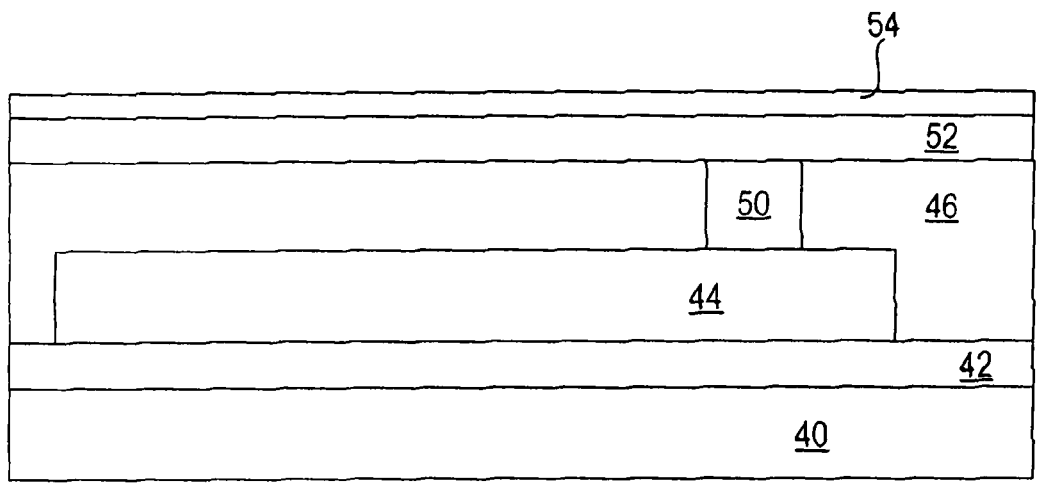
Figure 7:
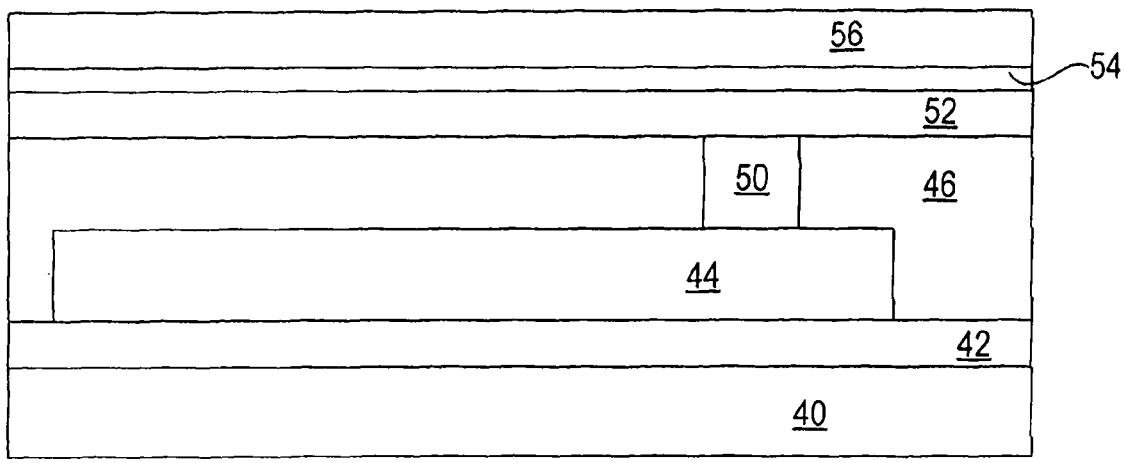
Figure 8:
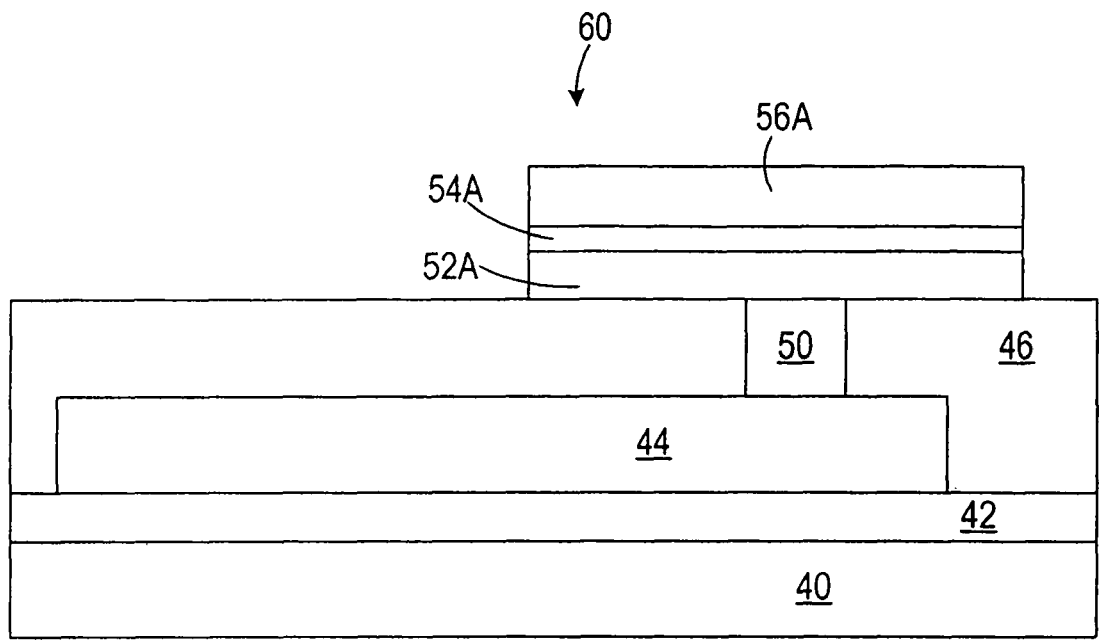

Next, an insulating layer 54 is formed over the conductive layer 52 FIG. 6). The material of this insulating layer 54 is typically a metal oxide, although it may also be a non-metal oxide, a nitride, or a polymer or nonorganic metallic compound. In the case of metal oxide, the layer 54 may be deposited using a variety of techniques, such as PVD from a metal oxide target, reactive-sputtered PVD deposition (in which metal atoms are sputtered in a reactive/oxidizing ambient to form the metal oxide film), CVD metal oxide deposition, ALD metal oxide deposition, chemical deposition from solutions containing metal oxide precursors, etc. Another technique which may be utilized is the oxidation of the bottom layer 52 surface to grow metal oxide corresponding to be metal of the layer 52. For example, in the case of a Ta layer 52, Ta thereof may be oxidized to create a $Ta_2O_5$ layer 54 on a remaining Ta layer 52. Additionally, if a metal oxide of a different metal than the metal of the bottom layer 52 is desired, a metal film may be deposited over the layer 52 and then completely reacted to form a metal oxide based on the metal of the metal film. For example, oxidizing a thin layer of Cu which has been deposited in situ using PVD onto a PVD Ta layer 52 produces $Cu_2O$ layered on top of $Ta_2O_5$ on Ta. Examples of metal oxides that can be created are Ta oxide, Ti oxide, W oxide, Ni oxide, Co oxide, Cu oxide, and layers of Cu oxide on top of Ta oxide, Ti oxide, W oxide, Ni oxide or Co oxide. It is also possible to create ternary compounds consisting of oxides of more than one metal $M1M2O_x$ by a variety of techniques. One method is to introduce a low concentration of a dopant metal into a binary oxide. This can be done by various techniques using implantation or diffusion from a solid source. For example, Cu can be introduced as a dopant into $Ta_2O_5$ by thermal diffusion from a solid Cu film contacting the $Ta_2O_5$. Another method would be to deposit a second oxide on the first oxide. The deposition technique itself or in conjunction with a subsequent anneal would cause an interfacial layer to form between the two oxides. This interfacial layer may be a doped layer, or a formation of a ternary oxide layers such as perovskite. This interfacial layer may be between five angstroms and 100 angstroms thick.

Another conductive layer 56 is provided over the resulting structure using any suitable technique (FIG. 7), including any of the techniques described above with regard to the conductive layer 52. This conductive layer 56 may for example be of any of the materials of the conductive layer 52 described above. The material of the conductive layer 56 may be different from the material of the conductive layer 52. If this conductive layer 56 is metal, the material thereof may be allowed to react with the underlying oxide 54 during formation of the conductive layer 56 or thereafter, resulting in an interfacial layer of that oxide or the formation of a ternary oxide layer.

Then (FIG. 8), using appropriate photolithographic techniques, bottom electrode 52A, oxide layer 54A, and top electrode 56A (including varieties thereof as described above) are formed, resulting in a metal-insulator-metal (MIM) device 60 including the bottom electrode 52A in contact with the W plug 50, oxide layer 54A on and in contact with the bottom electrode 52A, and top electrode 56A on in contact with the oxide layer 54A, so that the oxide layer 54A is between the bottom and top electrodes 52A, 56A. (It will be understood that the term "MIM" is used to describe these devices, even though, for example, the top and/or bottom electrodes may be nonmetallic). This MIM device 60, it will be seen, overlies the W conductor 44.

Figure 9:
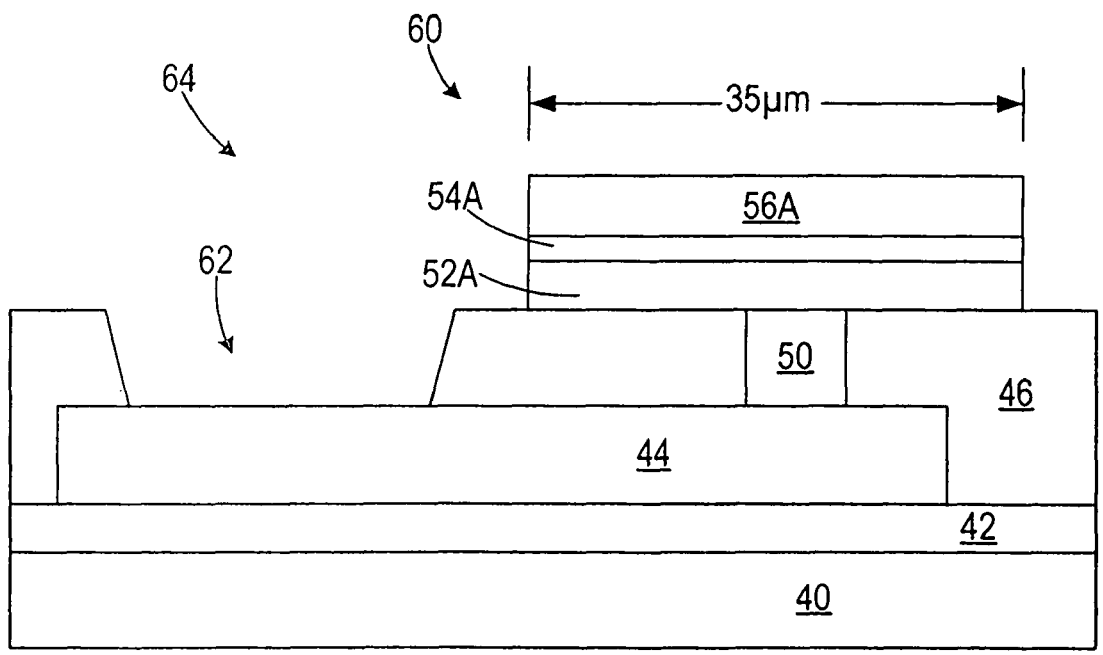
Figure 10:
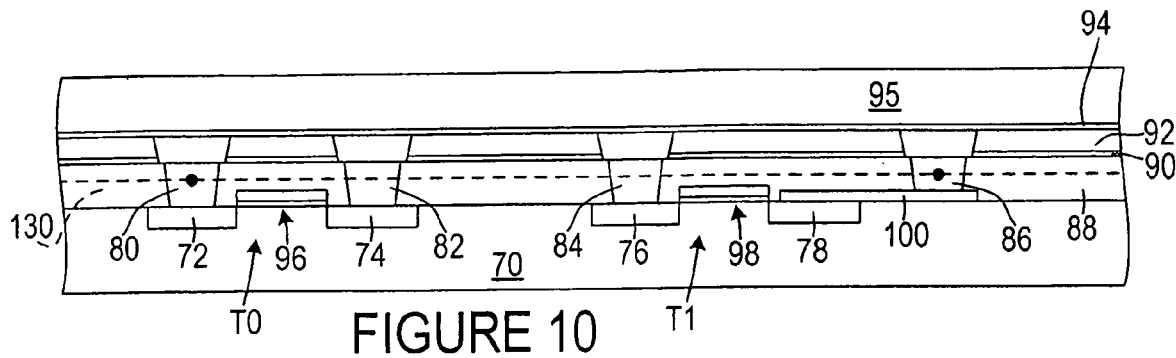
FIGS. 10-19 illustrate process steps in fabricating a second embodiment of test structure.

Then, using appropriate photolithographic techniques, an opening 62 is provided in the $SiO_2$ layer 46 to expose and allow access to a portion of the W conductor 44 (FIG. 9).

The thicknesses of the layers 52, 54, 56 can be chosen as desired, bounded only by practical limitations. For example, the bottom and top electrodes 52A, 56A must be of sufficient thickness so as not to limit current conduction through the device 60 during program/erase/read operations. The deposition techniques, resistivity, film mechanical properties, and etch patterning considerations are all factors that determine practical processing thicknesses. For reference, top and bottom electrodes 52A, 56A may range in thickness from between 10 nm to 500 nm, with typical electrodes ranging from 20 nm to 50 nm. The thickness of the oxide layer 54A will depend on desired electrical characteristics that the oxide layer 54A exhibits during device operation. Oxide layer properties that may affect his performance and may relate to thickness include film continuity, pinholes, film morphology, roughness, composition etc. For reference, oxide thickness may range from 5 nm to 500 nm, with typical oxides ranging from 10 nm to 50 nm.

MIM devices may be made in a wide variety of sizes (for example 20 nm-200,000 nm across, with typical structures ranging from 200 nm-35000 nm across, the particular structure illustrated having a dimension of 35 µm across as shown. The resulting structure 64 of FIG. 9 is designed to be directly probed for electrical testing. The electrode 52A is contacted by means of the exposed portion of the W layer 44 for test. The electrode 56A is contacted by a test probe directly on its exposed surface.

As will be seen, the test structure 64 is simple in design and use. The present approach is useful for rapidly testing and screening a wide variety of materials for the electrodes 52A, 56A and insulating layer 54A. Such an approach provides for rapid development of a product which achieves the desired operating characteristics.

FIGS. 10-19 illustrate the fabrication of a second embodiment of the invention. With initial reference to FIG. 10, the structure thus far formed includes a p+ semiconductor substrate 70 having n+ regions 72, 74, 76, 78 formed therein. In contact with the respective n+ regions 72, 74, 76, 78 are conductive W plugs 80, 82, 84, 86 which extend through $SiO_2$ layer 88, SiN layer 90, and $SiO_2$ layer 92. Overlying the $SiO_2$ layer 92 and the tops of the W plugs 80, 82, 84, 86 is a SiN layer 94, over which is provided $SiO_2$ layer 95. The n+ regions 72, 74, along with gate and gate oxide 96, form a transistor T0, and the n+ regions 76, 78, along with gate and gate oxide 98, form a transistor T1. The plug 80 contacts the n+ source region 72 of the transistor T0, while the plug 82 contacts the n+ drain region 74 of the transistor T0. The plug 84 contacts the n+ drain region 76 of the transistor T1, while the plug 86, through W body 100 on the substrate 70, contacts the n+ source region 78 of the transistor T1.

Figure 11:
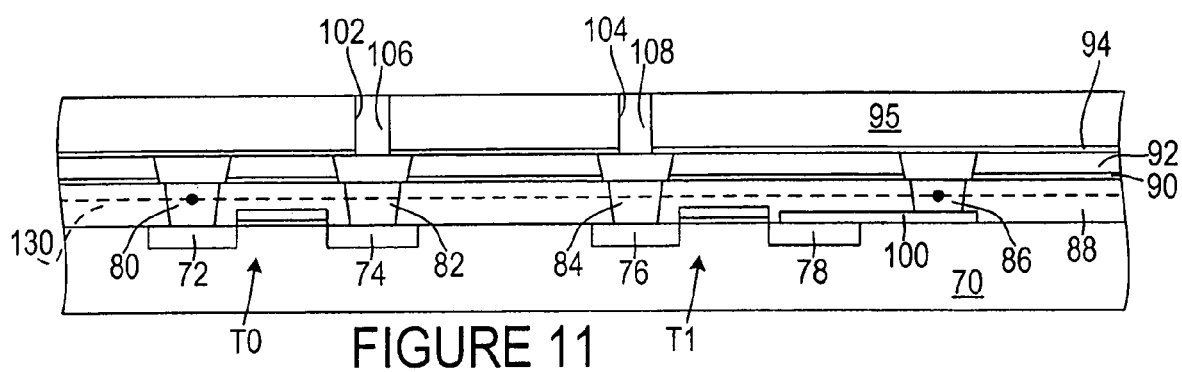
Figure 12:
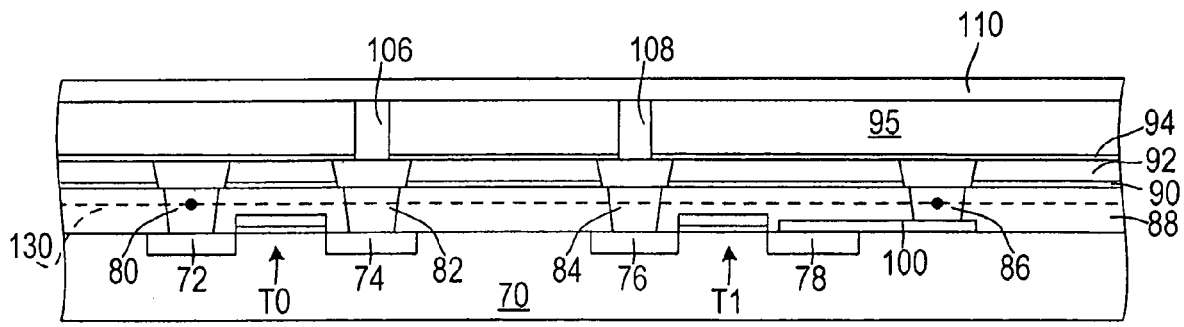
Figure 13:
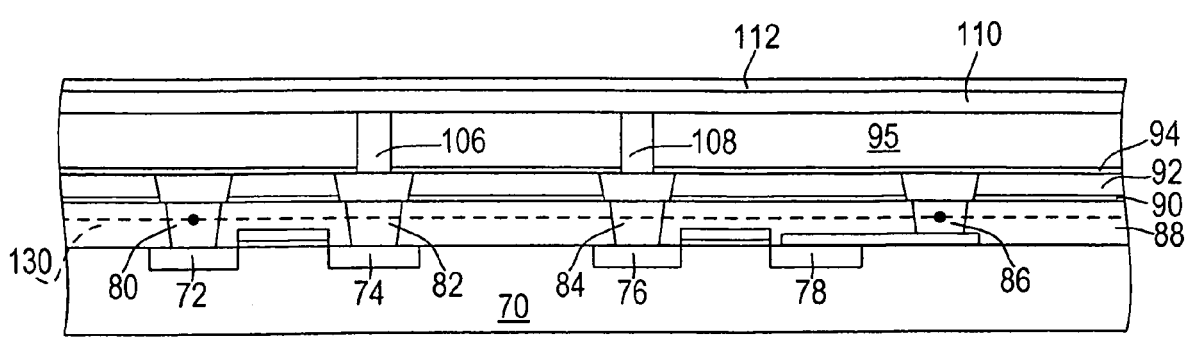
Figure 14:
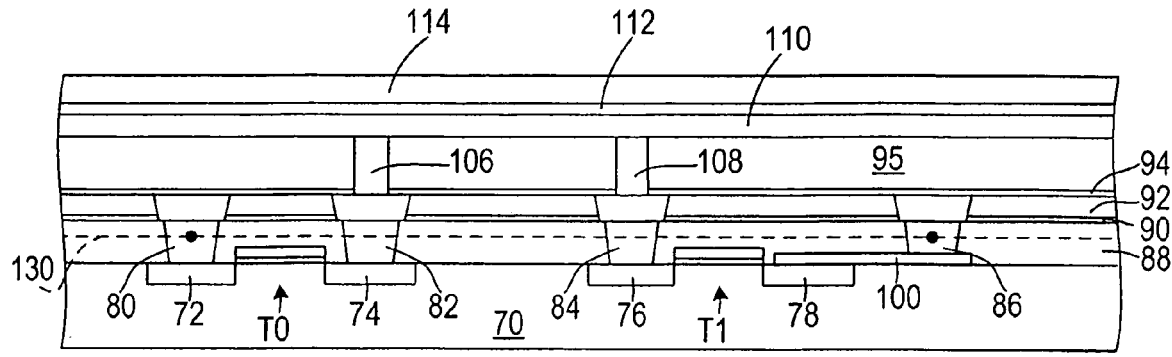

With reference to FIG. 11, using appropriate photolithographic techniques, openings 102, 104 are provided through the $SiO_2$ layer 95 and SiN layer 94 to the plugs 82, 84, and these openings 102, 104 are filled with conductive W plugs 106, 108. FIGS. 12-14 illustrate the formation of the conductive layer 110, insulating layer 112, and conductive layer 114, corresponding to the conductive layer 52, insulating layer 54, and conductive layer 56 of the previous embodiment. The present conductive layer 110, insulating layer 112, and conductive layer 114 may be formed in the same manner as described above, and may be of any of the materials described above.

Figure 15:
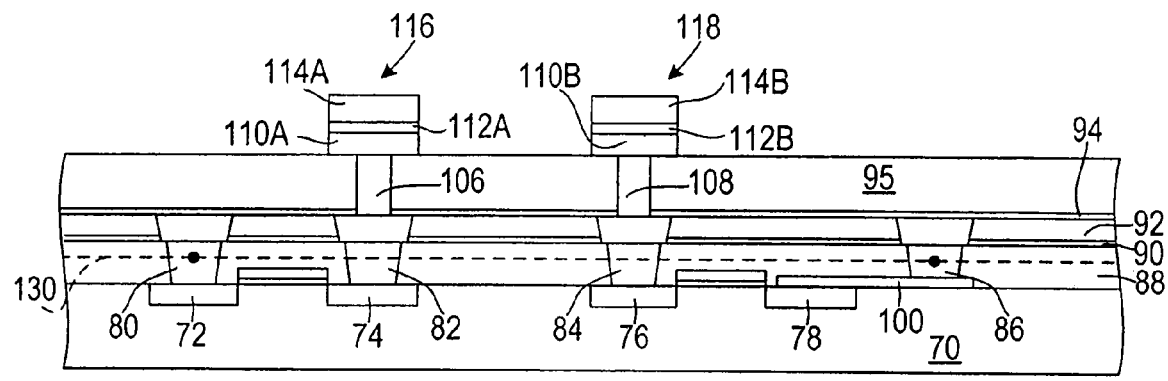

FIG. 15 illustrates the formation of the MIM devices 116, 118 using suitable photolithographic techniques. The device 116 includes electrode 110A in contact with plug 106, insulating layer 112A on and in contact with electrode 110A, and electrode 114A on and in contact with insulating layer 112A, so that the insulating layer 112A is between the electrode 110A and the electrode 114A. Likewise, the device 118 includes electrode 110B in contact with plug 108, insulating layer 112B on in contact with electrode 110B, and electrode 114B on in contact with insulating layer 112B.

Figure 16:
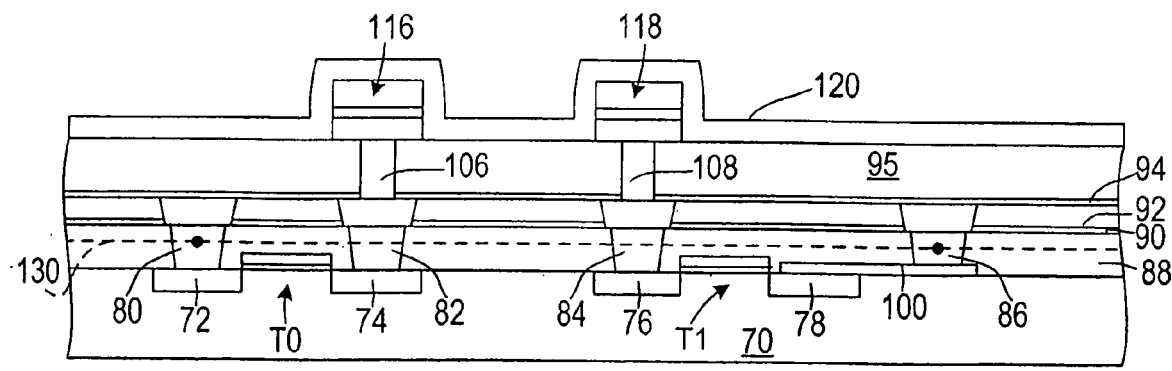
Figure 17:
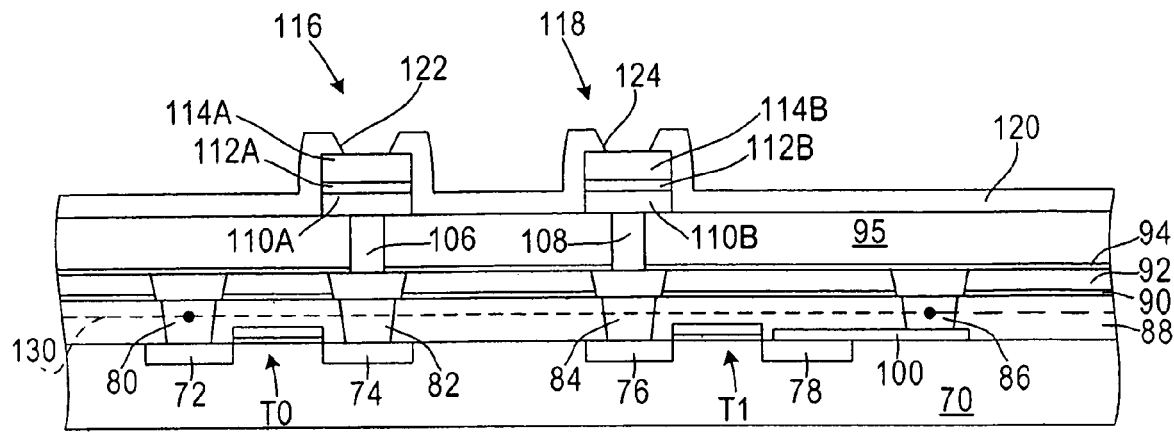
Figure 18:
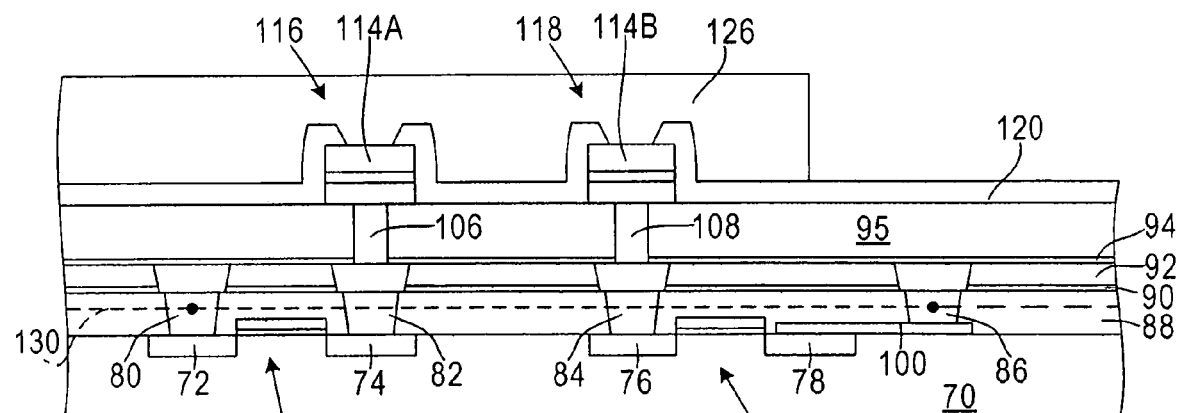

Next, a SiN layer 120 is deposited over the resulting structure by plasma-enhanced deposition (FIG. 16). Using suitable photolithographic techniques, the layer 120 is patterned as shown in FIG. 17, to provide openings 122, 124 therethrough to the respective electrodes 114A, 114B. A metal layer 126 is then provided over the resulting structure, and is patterned as shown in FIG. 18, using appropriate photolithographic techniques. This metal layer 126 acts as a common plate (CP) to connect the electrodes 114A, 114B of the devices 116, 118, with SiN remaining on the sides of each electrode-insulating layer-electrode stack ensuring that the bottom electrode of each device is isolated from the top electrode thereof.

Then, using appropriate photolithographic techniques, an opening 126 is provided through the SiN layer 120, $SiO_2$ layer 95, and SiN layer 94 to expose the plug 86.

Figure 19:
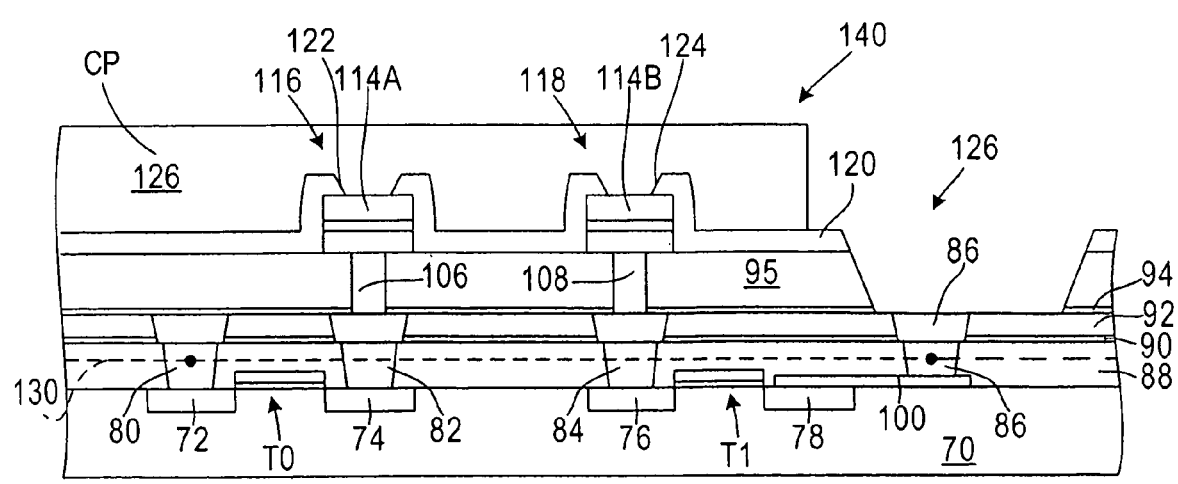
Figure 20:
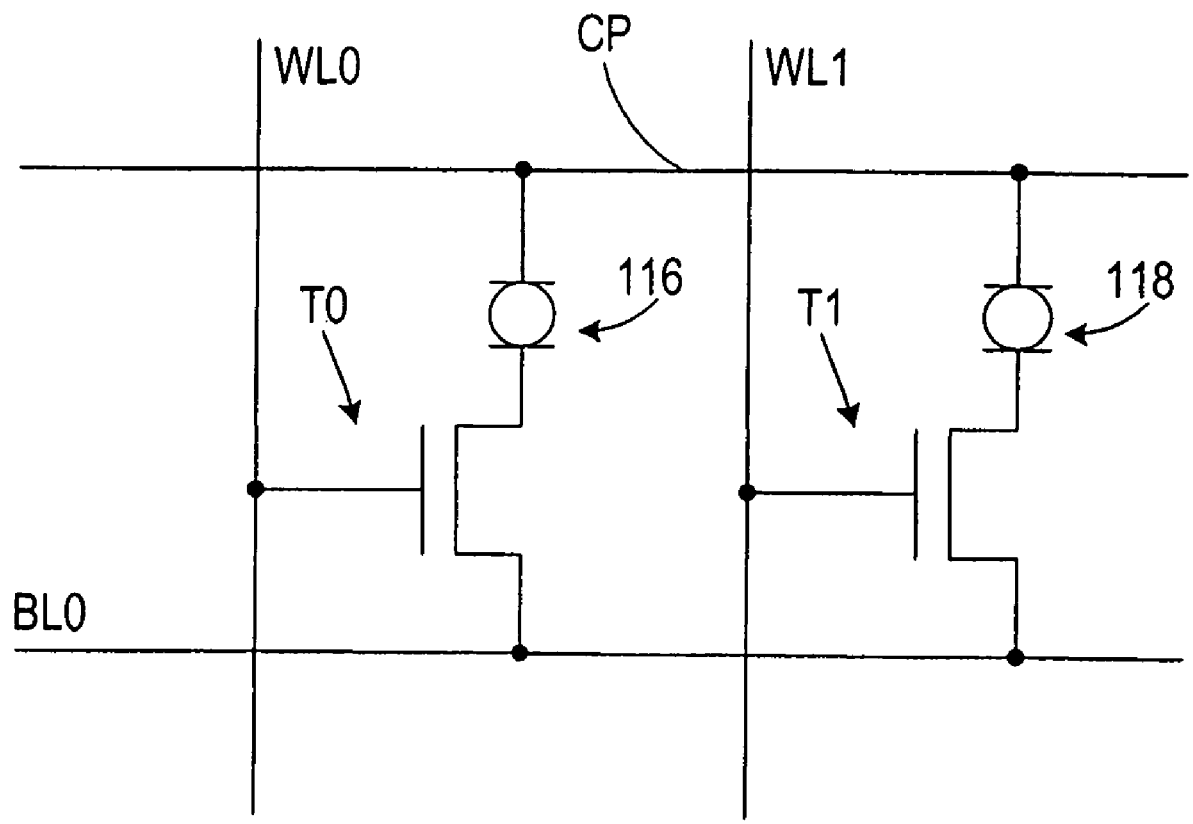
FIG. 20 is a schematic illustration of the structure of FIG. 19.

In this test structure 140, each of the memory devices is in series with a select transistor, closely corresponding to an actual typical memory array, so as to allow precise testing of the MIM devices in a product-like array. The schematic illustration of the structure of FIG. 19 is shown in FIG. 20, with the gates of the transistors T0, T1 being the word lines WL0, WL1, and the bit line BL0 being a conductor 130 connecting the plugs 80, 86 which in turn are connected to the source regions 72, 78.

The MIM devices of the present embodiment are smaller than in the previous embodiment, for example, having a dimension of 0.7 μm thereacross, meanwhile being fully integrated into a memory array. The smallest MIM structure that can be fabricated by this approach is governed by the minimum feature limitations for metal lithography and etch. A practical structure measuring 500 nm across is achievable. This more complex device is useful for careful electrical characterization of candidate materials, and can provide data that correlates to manufacturing yields.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic test structure comprising:
   a substrate;
   a transistor comprising first and second active regions in the substrate, and a gate;
   a first conductor connected to the first active region;
   a second conductor connected to the second active region;
   an electronic device comprising a first electrode connected to the first conductor via a first intervening conductor that has parallel and equal length side and top surfaces and a plurality of other stacked and directly connected intervening conductors that have widths that are different from the width of the first intervening conductor and have non parallel and angled side surfaces, a second electrode, and an insulating layer between the first and second electrodes wherein the second conductor is exposed for access thereto.

2. The electronic test structure of claim 1 wherein at least one of the electrodes is metallic.

3. The electronic test structure of claim 2 wherein said at least one of the electrodes comprises at least one material selected from the group consisting of Ta, Ti, Ni, Cu, Co, Au, Ag, Pt, Pd, W, Cr, Ca and Al.

4. The electronic test structure of claim 1 wherein said at least one of the electrodes comprises at least one material selected from the group consisting of TaN, TIN, ITO, RuO2, and SrRuO3.

5. The electronic test structure of claim 4 wherein the insulating layer comprises at least one material selected from the group consisting of Cu oxide, Ta oxide, Ti oxide, W oxide, Ni oxide, Co oxide, and a polymer material.

6. The electronic test structure of claim 5 wherein the insulating layer is a doped layer.

7. The electronic test structure of claim 1 wherein at least one of the recited first and second electrodes are formed of a non-metallic material.

* * * * *